United States Patent
Kashiwa et al.

(10) Patent No.: US 6,300,840 B1
(45) Date of Patent: Oct. 9, 2001

(54) MICROWAVE/MILLIMETER-WAVE INTEGRATED CIRCUIT

(75) Inventors: Takuo Kashiwa; Yoshinobu Sasaki; Naoki Tanahashi, all of Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/457,679

(22) Filed: Dec. 9, 1999

(30) Foreign Application Priority Data

Jun. 3, 1999 (JP) .................................................. 11-156544

(51) Int. Cl.[7] ................................. H03L 1/00; H01P 5/18
(52) U.S. Cl. ............................ 331/74; 331/96; 331/175; 333/112
(58) Field of Search .......................... 331/74, 96, 117 D, 331/175; 333/112, 115, 116

(56) References Cited

U.S. PATENT DOCUMENTS

| 3,973,204 | * | 8/1976 | Keiter | 333/202 |
| 4,392,115 | * | 7/1983 | Volluet et al. | 331/107 A |
| 4,937,541 | * | 6/1990 | Podell et al. | 333/116 |
| 5,159,298 | * | 10/1992 | Dydyk | 333/116 |
| 5,294,895 | | 3/1994 | Feeney et al. | 331/9 |
| 5,504,465 | * | 4/1996 | Yung et al. | 332/105 |

FOREIGN PATENT DOCUMENTS

| 6-177648 | 6/1994 | (JP) . |
| 9-46225 | 2/1997 | (JP) . |
| 10-242719 | 9/1998 | (JP) . |

* cited by examiner

Primary Examiner—Siegfried H. Grimm
(74) Attorney, Agent, or Firm—Leydig, Voit & Mayer, Ltd.

(57) ABSTRACT

A microwave/millimeter-wave integrated circuit (IC) realizes stable oscillation by reducing time-based variation of a load impedance. This IC connects an oscillator to an input terminal of a Lange coupler and connects to the isolation port of the Lange coupler a terminating resistor having a resistance equal to the load impedance connected to the output terminals of the Lange coupler. This connection stabilizes load impedance to the oscillator, and reduces variation in the oscillation frequency as a result of changes in load impedance.

4 Claims, 5 Drawing Sheets

MICROWAVE/MILLIMETER-WAVE INTEGRATED CIRCUIT

BACKGROUND OF THE INVENTION

1. Field of the Invention

The present invention relates to a microwave or millimeter-wave integrated circuit using a semiconductor substrate, commonly known as a microwave monolithic integrated circuit, and more specifically to an oscillation circuit for generating microwave or millimeter-wave signals with circuit operation stabilized according to load conditions.

2. Description of Related Art

Oscillators used in sensors and communications devices operating in the microwave and millimeter-wave bands, referred to below simply as high frequency bands, require a low phase noise characteristic. Phase noise in an oscillator is a variation in the oscillation frequency with a period longer than that of the oscillation frequency; low phase noise is indicative of stable oscillator operation. Factors contributing to phase noise include bias, thermal noise, and modulation caused by nonlinear operation of active elements.

Changes in load impedance can also cause the oscillation frequency of an oscillator to vary, a phenomenon known as pulling. To avoid problems caused by pulling, variations in load are removed by, for example, connecting the oscillator to an amplifier connected to multiple stages or to an isolator.

However, because of the difficulties in manufacturing a resonance circuit with a Q sufficiently high to assure stable oscillator operation in such high frequency band regions as the millimeter-wave band, oscillators operating in such high frequency bands are subject to even greater loads.

It is to be noted that use of Lange couplers is taught in Japanese Patent Laid-Open Publication Nos. 10-242719 and 6-177648, and Japanese Patent Laid-Open Publication 9-46225 teaches a common phase-locked oscillator (PLO).

SUMMARY OF THE INVENTION

With consideration for the above noted problem, an object of the present invention is to provide a microwave/millimeter-wave integrated circuit capable of maintaining stable oscillation by reducing time-based variation in load impedance.

To achieve this object, a microwave/millimeter-wave integrated circuit according to the present invention comprises an oscillator for generating and outputting a high frequency signal in the microwave/millimeter-wave band, and a Lange coupler, to an input terminal of which is input the high frequency signal output from the oscillator, and to an isolation terminal of which is connected a terminating resistance equal to a load impedance connected to an output terminal.

Preferably, this high frequency integrated circuit further comprises an amplifier for amplifying and outputting a high frequency signal output from the Lange coupler. In this case the output signal from the oscillator can be amplified while also improving the output characteristic.

Alternatively, a high frequency integrated circuit according to the present invention comprises an oscillator for generating and outputting a high frequency signal in the microwave/millimeter-wave band; and a directional coupler having a main signal line to one end of which the high frequency signal from the oscillator is input, and to the other end of which is connected a terminating resistor of a predetermined resistance. In this case, a high frequency signal output from the oscillator is input to one end of the main signal line of the directional coupler, and a terminating resistor of a specific resistance is connected to the other end of this main signal line. It is therefore possible to stabilize the load impedance of the oscillator, reduce variation in the oscillation frequency as a result of variation in load impedance, and thereby reduce phase noise.

This high frequency wave integrated circuit further preferably comprises an amplifier for amplifying and outputting a high frequency signal output from a sub-transmission line of the directional coupler. By thus using an amplifier, the output signal from the oscillator can be amplified while also improving the output characteristic.

A microwave/millimeter-wave integrated circuit for generating and outputting a high frequency signal in the microwave/millimeter-wave band according to a further aspect of the present invention has an oscillator for generating and outputting a high frequency signal in the microwave/millimeter-wave band; a directional coupler having a main signal line to one end of which is input the high frequency signal from the oscillator; an amplifier for amplifying and outputting a high frequency signal input from the oscillator through the main signal line of the directional coupler, and having a bias input terminal to which bias is input from an external source; and a phase detecting integrated circuit for phase detecting a signal reflected from the amplifier input through the sub line of the directional coupler, generating an inverse phase signal of which the phase is opposite the detected phase, and outputting the inverse phase signal to a bias input terminal of the amplifier.

With this aspect of the invention, a phase detector detects the phase component of the signal reflected from the amplifier and obtained through a directional coupler, and a signal inverting this detected phase is applied to the bias input terminal of the amplifier. Variation over time in the input impedance of the amplifier is therefore cancelled, change in the load impedance as a result of varying input impedance can be suppressed, and phase noise can thus be reduced.

A microwave/millimeter-wave integrated circuit according to yet a further aspect of the invention has an oscillator for generating and outputting a high frequency signal in the microwave/millimeter-wave band; and a phase shifter for shifting phase of a high frequency signal output from the oscillator to a predetermined phase setting.

By thus using a phase shifter to shift the phase of the oscillator output signal so that change in the oscillation frequency is gradual, a microwave/millimeter-wave integrated circuit according to this aspect of the invention can prevent variation over time in the load impedance connected to the phase shifter output, reduce change in the oscillation frequency as a result of varying input impedance, and thus reduce phase noise.

The predetermined phase to which the phase of the oscillator output signal is shifted is preferably a phase at which frequency change in high frequency signal output from the oscillator is smallest for a phase change induced by a load of a particular voltage standing wave ratio connected to the output terminal of the phase shifter. It is therefore possible to prevent time-based variation in the load impedance to the oscillator, reduce change in the oscillation frequency as a result of varying input impedance, and thus reduce phase noise.

Other objects and attainments together with a fuller understanding of the invention will become apparent and appreciated by referring to the following description and claims taken in conjunction with the accompanying drawings.

DESCRIPTION OF THE PREFERRED EMBODIMENTS

The preferred embodiments of the present invention are described below with reference to the accompanying figures.

Embodiment 1

Figure 1:
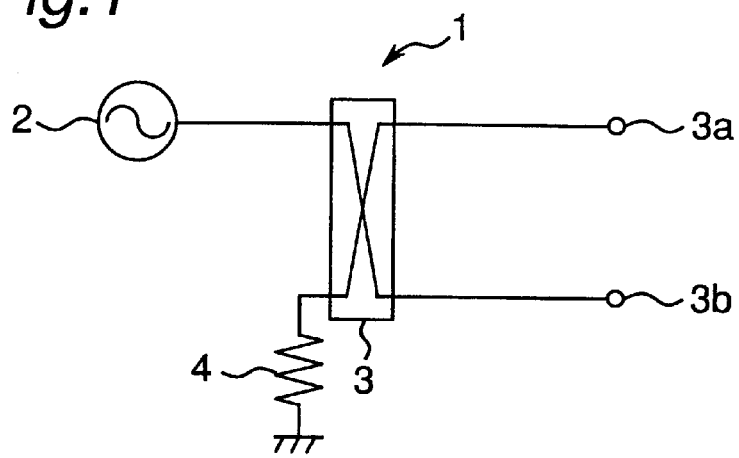
FIG. 1 is a typical circuit diagram of a microwave/millimeter-wave integrated circuit according to a first preferred embodiment of the present invention.

FIG. 1 is a typical circuit diagram of a microwave/millimeter-wave integrated circuit 1 according to a first preferred embodiment of the present invention. As shown in FIG. 1, this microwave/millimeter-wave IC 1 comprises a microwave/millimeter-wave band oscillator 2 for generating and outputting a microwave/millimeter-wave band signal, a Lange coupler 3, and a terminating resistor 4 connected to the Lange coupler 3. It is to be noted that the resistance of this terminating resistor 4 is equal to the total load impedance connected to first output port 3a and second output port 3b of microwave/millimeter-wave IC 1, and is assumed in the following description of this exemplary embodiment to be 50Ω.

Ideally with a microwave/millimeter-wave IC 1 thus comprised, half the output from oscillator 2 is supplied to first output port 3a and half is supplied to second output port 3b. The terminating resistor 4 is also connected to the isolation port of Lange coupler 3, and the load impedance apparent to the oscillator 2 is 50Ω even when there is no output from oscillator 2.

Figure 2:
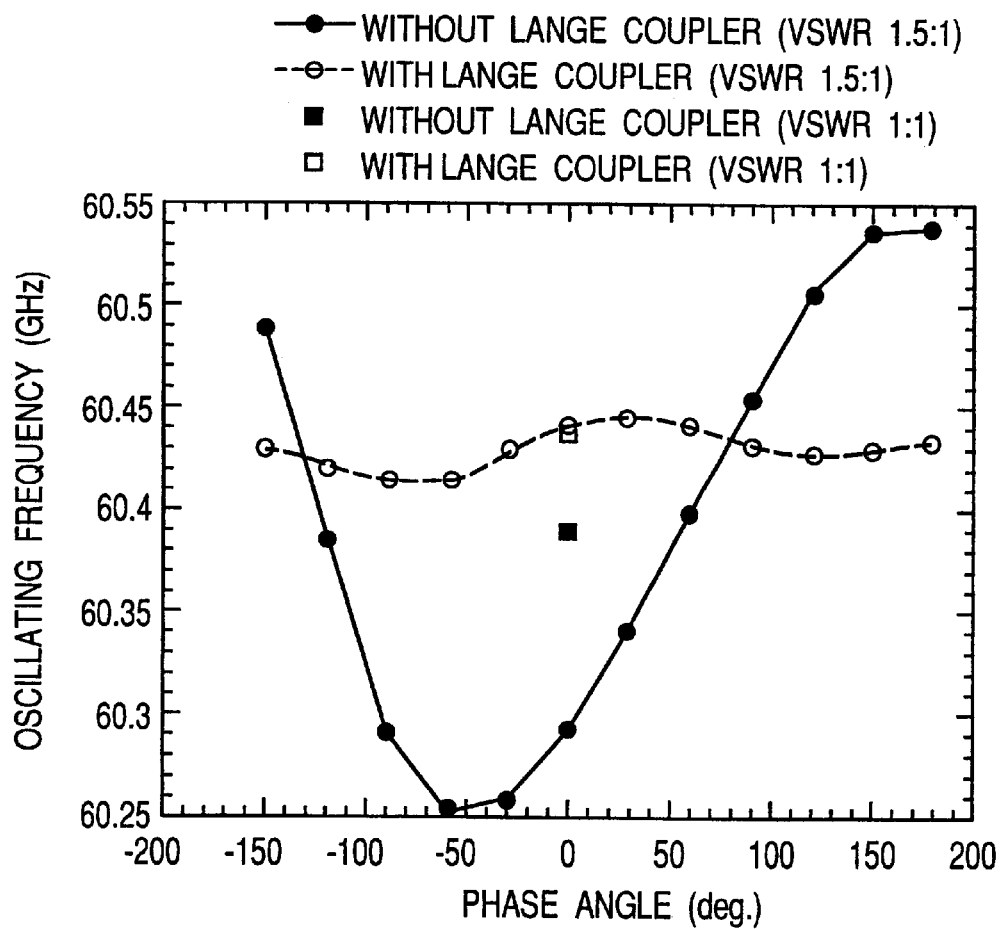
FIG. 2 is a graph showing the oscillation frequency—phase angle characteristic of the microwave/millimeter-wave integrated circuit shown in FIG. 1 under a first set of conditions.

FIG. 2 is a graph showing the oscillation frequency versus phase angle characteristic of the microwave/millimeter-wave integrated circuit shown in FIG. 1 under a first set of conditions. FIG. 2 more specifically compares the change in oscillation frequency with a change in phase when the load connected to first output port 3a and second output port 3b has a voltage standing wave ratio (VSWR) of 1:1 and 1.5:1. Note that FIG. 2 shows results obtained with and without the Lange coupler 3. In addition, phase was changed 360 degrees at a VSWR of 1.5:1.

As will be known from FIG. 2, the oscillation frequency ranges 290 MHz, from 60.54 GHz to 60.25 GHz, when there is a 360 degree phase change and no Lange coupler 3, but when the Lange coupler 3 is used, the oscillation frequency ranges 30 MHz, from 60.41 GHz to 60.44 GHz, when there is a 360 degree phase change. As this graph shows, variation in the oscillation frequency due to change in the load impedance can be reduced. That is, because frequency variation is phase noise, the effects of pulling on phase noise can be reduced when, for example, the input impedance of an amplifier connected immediately after the microwave/millimeter-wave IC 1 is fluctuating due to a variable supply voltage, for example.

Figure 3:
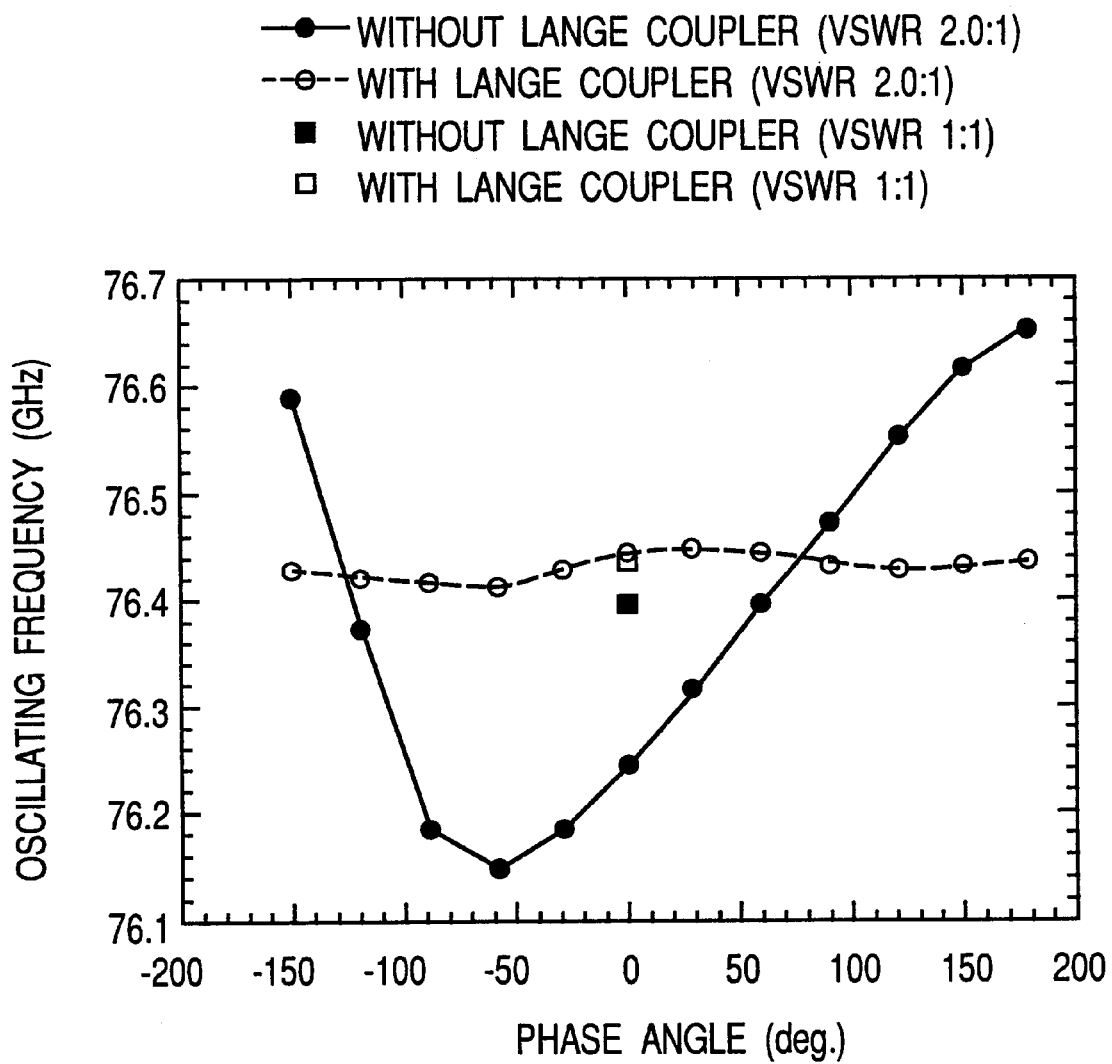
FIG. 3 is a graph showing the oscillation frequency—phase angle characteristic of the microwave/millimeter-wave integrated circuit shown in FIG. 1 under a second set of conditions.
Figure 4:
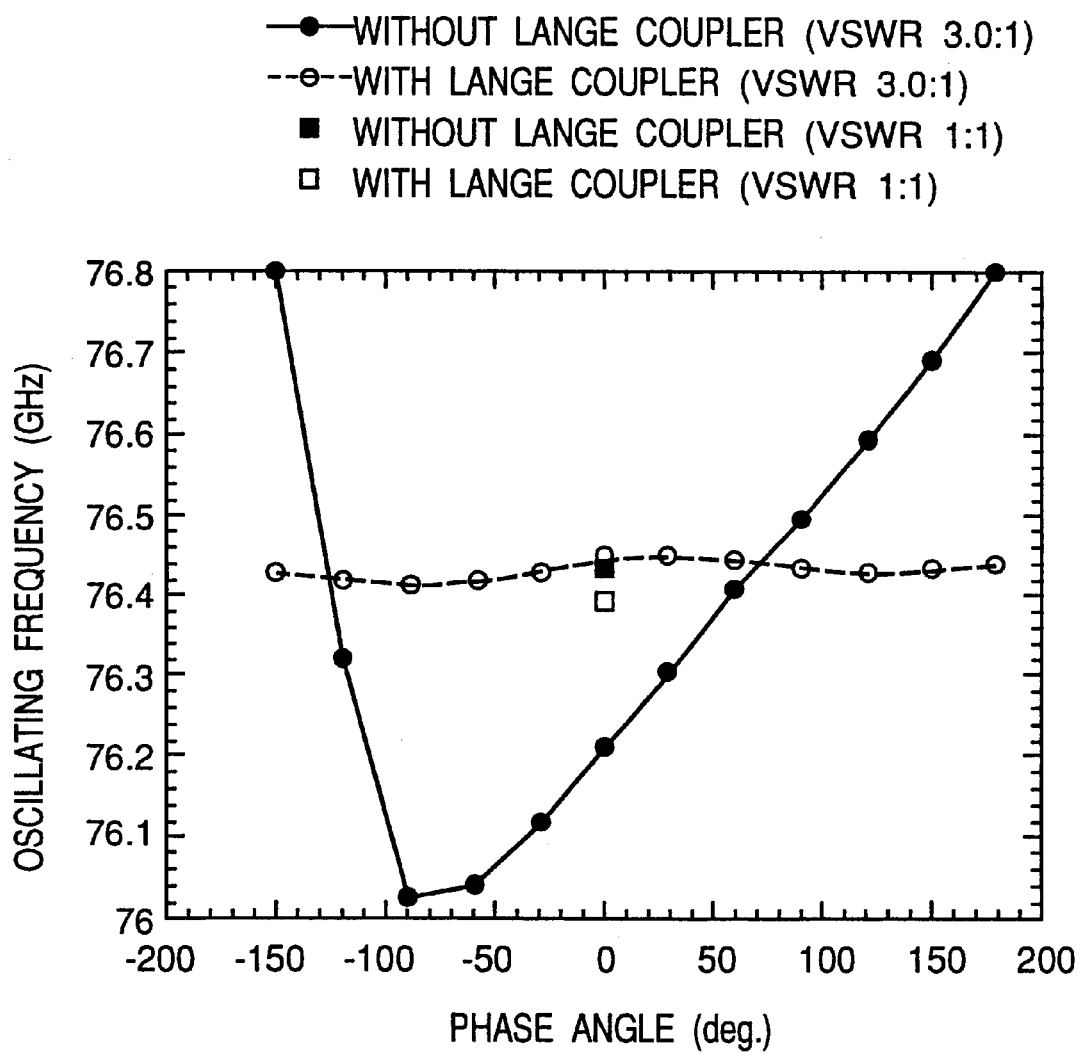
FIG. 4 is a graph showing the oscillation frequency—phase angle characteristic of the microwave/millimeter-wave integrated circuit shown in FIG. 1 under a third set of conditions.

FIG. 3 and FIG. 4 are similar graphs showing the performance of the microwave/millimeter-wave IC 1 shown in FIG. 1 under different operating conditions. Note that FIG. 3 compares the change in oscillation frequency with a change in phase when the load connected to first output port 3a and second output port 3b has a voltage standing wave ratio (VSWR) of 1:1 and 2:1. FIG. 4 likewise compares the change in oscillation frequency when the VSWR of the connected load was 1:1 and 3:1. Results in both FIG. 3 and FIG. 4 were obtained with and without the Lange coupler 3. Note, further, that phase was changed 360 degrees at a VSWR of 2.0:1 and 3.0:1.

It can be seen from FIG. 3 and FIG. 4 that the effect of the present invention reducing phase noise as a result of pulling increases as the input VSWR increases and deteriorates. For example, when no Lange coupler 3 is used and the VSWR is 3.0:1 as shown in FIG. 4, the oscillation frequency changes as much as 800 MHz with a 360 degree phase change. However, when Lange coupler 3 is used with a termination provided by terminating resistor 4, the effect on circuits connected after the Lange coupler 3 can be reduced, and variation in the oscillation frequency with a change in load impedance can be suppressed to less than ¹⁄₁₀ that when a Lange coupler 3 is not used.

Figure 5:
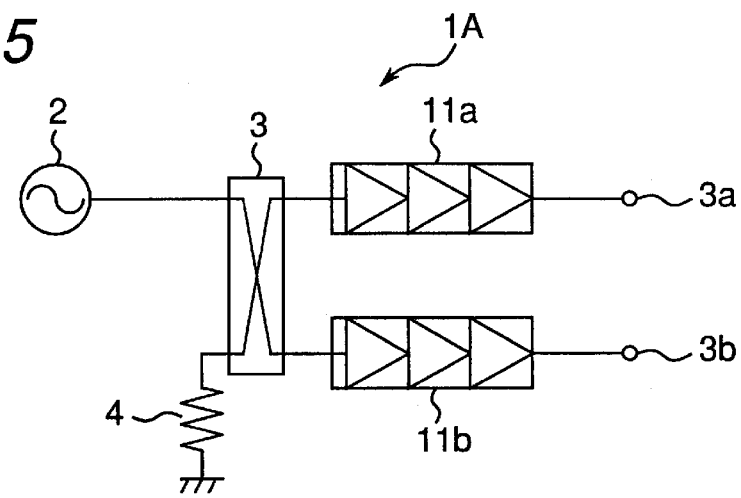
FIG. 5 is a typical circuit diagram of a microwave/millimeter-wave integrated circuit according to an alternative version of the first embodiment shown in FIG. 1.

It is alternatively possible to connect to each output of the Lange coupler 3, as shown in FIG. 5, buffer amplifiers 11a and 11b for amplifying the output signal from the oscillator 2. Thus, variation in the oscillation frequency in response to variation in the input impedance as a result of fluctuation in the power supply of buffer amplifiers 11a and 11b is reduced by the effect of terminating resistor 4 connected to the isolation port of the Lange coupler 3, thus reducing change in the oscillation frequency, that is, phase noise, caused by variation over time in the input impedance of buffer amplifier 11a and 11b. The output signal from oscillator 2 can also be amplified.

Figure 6:
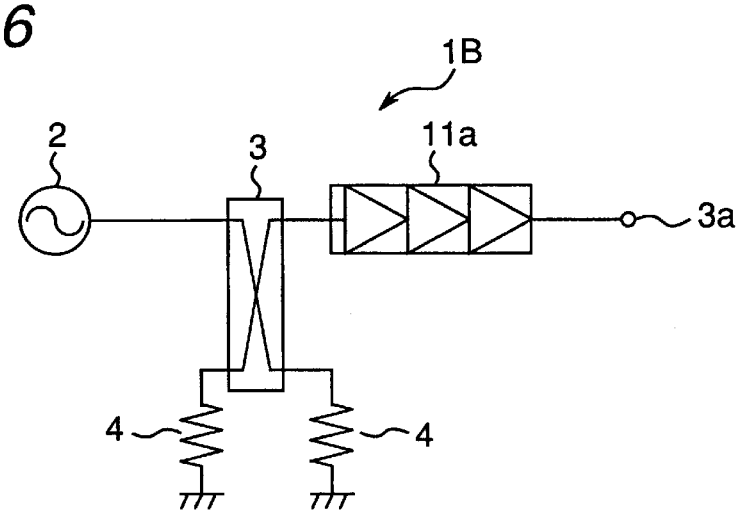
FIG. 6 is a typical circuit diagram of a microwave/millimeter-wave integrated circuit according to a further alternative version of the first embodiment shown in FIG. 1.

When two ports are not required for microwave/millimeter-wave IC 1 output, it is yet further alternatively possible, as shown in FIG. 6, to terminate the second output port 3b using another terminating resistor 4. A device thus comprised achieves the same effects at the microwave/millimeter-wave IC 1 shown in FIG. 1.

By connecting the oscillator 2 to the input terminal of a Lange coupler 3, and connecting a terminating resistor with resistance equal to the total load impedance connected to the output terminals of the Lange coupler 3 to the Lange coupler 3 isolation port, a microwave/millimeter-wave integrated circuit according to the first embodiment of the present invention described above can thus stabilize the load impedance of the oscillator 2, and thereby reduce variation in the oscillation frequency as a result of load impedance change. Phase noise as a result of load impedance change can, therefore, also be reduced.

Embodiment 2

A directional coupler can be used in place of the Lange coupler 3 used in a microwave/millimeter-wave IC 1 according to the first embodiment above. A microwave/millimeter-wave IC so comprised is described below as a second preferred embodiment of the present invention.

Figure 7:
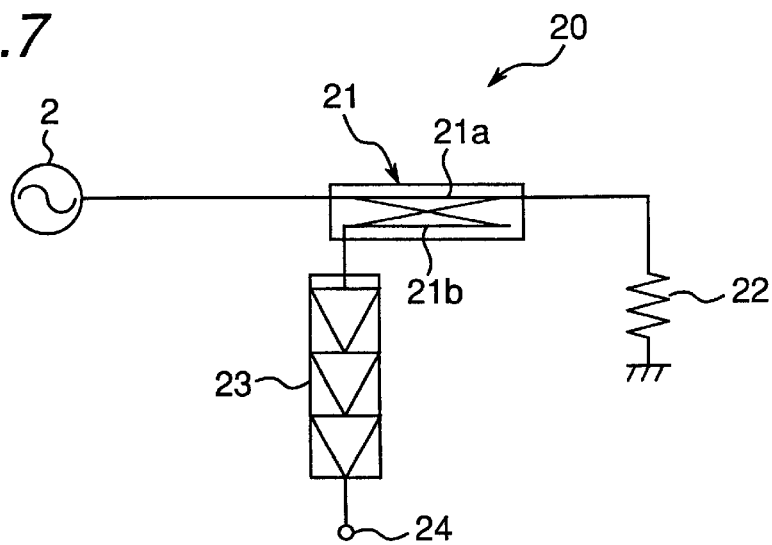
FIG. 7 is a typical circuit diagram of a microwave/millimeter-wave integrated circuit according to a second preferred embodiment of the present invention.

FIG. 7 is a typical circuit diagram of a microwave/millimeter-wave integrated circuit according to a second preferred embodiment of the present invention. Note that like parts in FIG. 1 and FIG. 7 are identified by like reference numerals, and further description of those parts is omitted below.

As shown in FIG. 7, this microwave/millimeter-wave IC 20 comprises an oscillator 2, a directional coupler 21, a terminating resistor 22 connected to directional coupler 21, and a buffer amplifier 23. The oscillator 2 is connected to one end of main transmission line 21a, and terminating resistor 22 is connected between the other end of main line 21a and ground. An input to buffer amplifier 23 is connected to one end of sub-transmission line 21b. The output of buffer amplifier 23 is connected to output port 24 of the microwave/millimeter-wave IC 20.

In a microwave/millimeter-wave IC 20 thus comprised, the load impedance of the oscillator 2 is determined by terminating resistor 22 connected to directional coupler 21. A stable load can be realized by setting terminating resistor 22 to a specific resistance, such as 50Ω, so that buffer amplifier 23 obtains and then outputs the signal output from oscillator 2 from one end of sub line 21b in directional coupler 21.

As will be known from the above description, by connecting the oscillator 2 to one end of a main line 21a of a directional coupler 21, and connecting a specific terminating resistance to the other end of the main line 21a, a microwave/millimeter-wave integrated circuit according to this embodiment of the present invention stabilizes the load impedance of the oscillator 2, and thereby reduces variation in the oscillation frequency, and thus phase noise, with change in the load impedance.

Embodiment 3

As described above, a microwave/millimeter-wave IC 20 according to the above second embodiment of the present invention connects the oscillator 2 to one end of a main line 21a of a directional coupler 21, and connects a specific terminating resistance to the other end of the main line 21a. It is alternatively possible, as described below according to a third embodiment of the present invention, however, to use a directional coupler without using terminating resistor 22.

Figure 8:
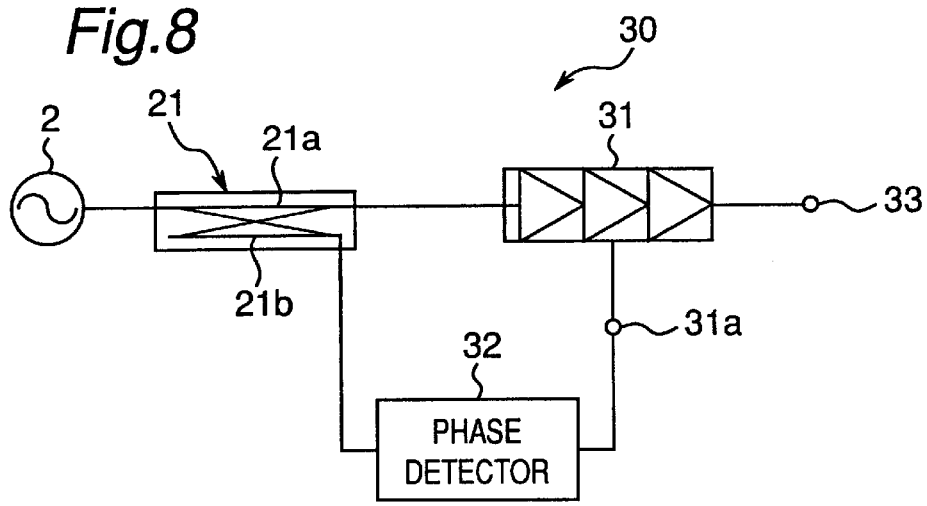
FIG. 8 is a typical circuit diagram of a microwave/millimeter-wave integrated circuit according to a third preferred embodiment of the present invention.

FIG. 8 is a typical circuit diagram of a microwave/millimeter-wave integrated circuit according to a third preferred embodiment of the present invention. Note that like parts in FIG. 1, FIG. 7, and FIG. 8 are identified by like reference numerals, and further description of those parts is omitted below.

As shown in FIG. 8, a microwave/millimeter-wave IC 30 according to this preferred embodiment of the invention comprises an oscillator 2, directional coupler 21, buffer amplifier 31 connected to directional coupler 21, and a phase detecting IC 32 such as a phase-locked loop circuit for detecting the phase component of a reflected signal from buffer amplifier 31.

The oscillator 2 is connected to one end of main transmission line 21a. Buffer amplifier 31 is connected between the other end of main line 21a and output port 33.

An input to phase detecting IC 32 is connected to one end of sub-transmission line 21b of directional coupler 21. The output of phase detecting IC 32 is connected to bias input terminal 31a of buffer amplifier 31, which has a bias circuit.

In a microwave/millimeter-wave IC 30 thus comprised, the signal reflection of the oscillator 2 output signal from buffer amplifier 31 is input through intervening directional coupler 21 to phase detecting IC 32. The phase detecting IC 32 then detects the phase of the reflected signal to obtain the phase component, and generates and outputs a signal of the inverse phase to bias input terminal 31a of buffer amplifier 31 for superposition on the bias of buffer amplifier 31. Time-based variation in the VSWR of the buffer amplifier 31 is thus cancelled.

A microwave/millimeter-wave IC according to this third embodiment thus detects the phase component of the signal reflected from buffer amplifier 31 through directional coupler 21, and superposes a signal of the opposite phase on the bias of buffer amplifier 31, by means of phase detecting IC 32. This microwave/millimeter-wave IC can thus cancel time-base variation in the input impedance of buffer amplifier 31, thereby suppressing variation in the load impedance resulting from such variable impedance and reducing phase noise.

Embodiment 4

A microwave/millimeter-wave integrated circuit according to a fourth preferred embodiment of the present invention is basically a microwave/millimeter-wave integrated circuit according to the first embodiment in which the Lange coupler 3 is replaced by a phase shifter.

Figure 9:
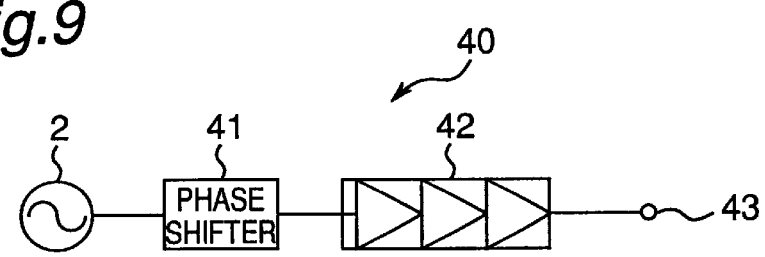
FIG. 9 is a typical circuit diagram of a microwave/millimeter-wave integrated circuit according to a fourth preferred embodiment of the present invention.

FIG. 9 shows a microwave/millimeter-wave integrated circuit according to this fourth embodiment of the present invention. Note that like parts in FIG. 1 and FIG. 9 are identified by like reference numerals, and further description of those parts is omitted below.

As shown in FIG. 9, this microwave/millimeter-wave integrated circuit 40 comprises a oscillator 2, phase shifter 41, and buffer amplifier 42. The oscillator 2 is connected through phase shifter 41 to an input to buffer amplifier 42. An output of buffer amplifier 42 is connected to output port 43 of microwave/millimeter-wave integrated circuit 40.

Figure 10:
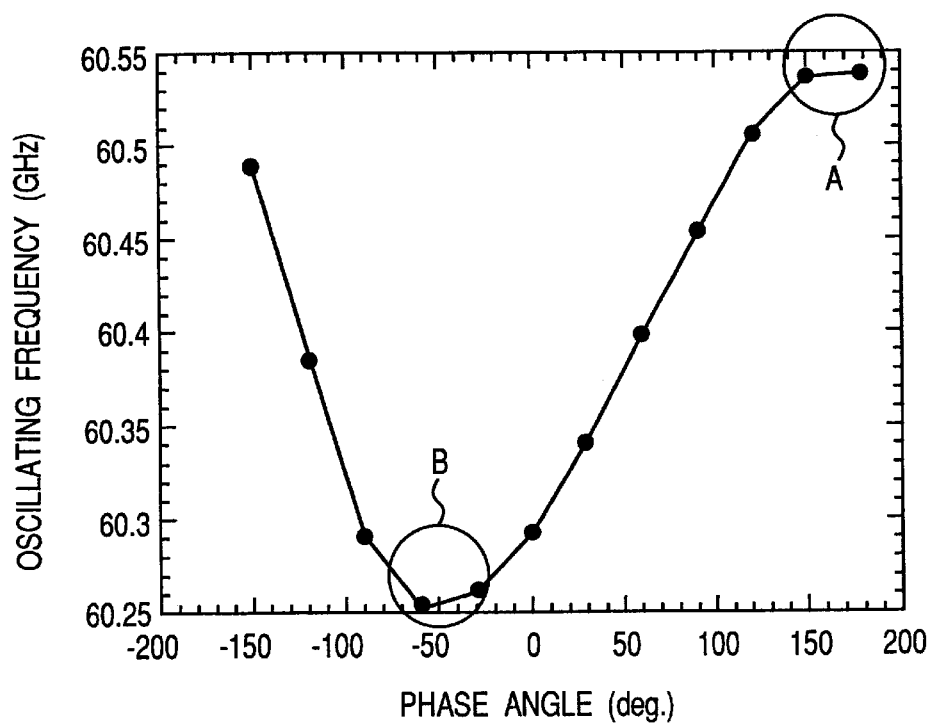
FIG. 10 is a graph showing the oscillation frequency—phase angle characteristic of a conventional oscillation circuit used to describe the operating principle of the microwave/millimeter-wave integrated circuit shown in FIG. 9.

FIG. 10 shows the change in oscillation frequency when a load with a 1.5:1 VSWR is connected without a Lange coupler 3 connected immediately after the oscillator 2 as shown in FIG. 2. As shown in FIG. 10, the change in oscillation frequency for a change in phase is gradual in the areas around a phase angle of −60 degrees and +150 degrees as shown by circles A and B. As a result, the phase of the output signal from oscillator 2 is shifted by phase shifter 41 to approximately −60 degrees or +150 degrees, and this phase-shifted oscillator output is then obtained from output port 43 of buffer amplifier 42.

By thus using a phase shifter 41 to shift the phase of the output signal from oscillator 2 to a phase at which the change in oscillation frequency is gradual, a microwave/millimeter-wave integrated circuit according to this preferred embodiment can prevent time-based variation in the load impedance of oscillator 2, including load impedance from the buffer amplifier 42. This microwave/millimeter-wave integrated circuit thus reduces variation in the oscillation frequency due to change in the load impedance, and thereby reduces phase noise.

Although the present invention has been described in connection with the preferred embodiments thereof with reference to the accompanying drawings, it is to be noted that various changes and modifications will be apparent to those skilled in the art. Such changes and modifications are to be understood as included within the scope of the present invention as defined by the appended claims, unless they depart therefrom.

What is claimed is:

1. A microwave/millimeter-wave integrated circuit for generating and outputting a high frequency signal in the microwave/millimeter-wave band comprising:

an oscillator for generating and outputting a high frequency signal in the microwave/millimeter-wave band;

a Lange coupler having an input terminal to which is input the high frequency signal output from the oscillator, first and second output terminals, and an isolation terminal;

a load impedance connected across the first and second output terminals; and a terminating resistance connected to the isolation terminal and having a resistance equal to the load impedance.

2. The microwave/millimeter-wave integrated circuit according to claim 1, further comprising an amplifier connected between the first output terminal of the Lange coupler and the load impedance for amplifying and outputting a high frequency signal output from the first output terminal of the Lange coupler.

3. The microwave/millimeter-wave integrated circuit according to claim 2, further comprising a second amplifier connected between the second output terminal of the Lange coupler and the load impedance for amplifying and outputting a high frequency signal output from the second output terminal of the Lange coupler.

4. A microwave/millimeter-wave integrated circuit for generating and outputting a high frequency signal in the microwave/millimeter-wave band, comprising:

an oscillator for generating and outputting a high frequency signal in the microwave/millimeter-wave band;

a directional coupler having a main signal line to a first end of which is input the high frequency signal output from the oscillator;

an amplifier for amplifying and outputting a high frequency signal input from the oscillator through the main signal line of the directional coupler, the amplifier having a bias input terminal to which a bias is input from an external source; and a phase detecting integrated circuit for detecting phase of a signal reflected from the amplifier input through a sub line of the directional coupler, generating an inverse phase signal having a phase opposite the phase detected, and outputting the inverse phase signal to the bias input terminal of the amplifier.

* * * * *